(12) United States Patent
Zhao

(10) Patent No.: US 7,423,252 B2
(45) Date of Patent: *Sep. 9, 2008

(54) SLOW TAIL COMPENSATION

(75) Inventor: Yang Zhao, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/621,506

(22) Filed: Jan. 9, 2007

(65) Prior Publication Data

US 2007/0108373 A1    May 17, 2007

Related U.S. Application Data

(63) Continuation of application No. 11/322,313, filed on Dec. 30, 2005, now Pat. No. 7,180,048.

(60) Provisional application No. 60/733,047, filed on Nov. 3, 2005.

(51) Int. Cl.
*H01L 31/00* (2006.01)

(52) U.S. Cl. .................................. 250/214 R

(58) Field of Classification Search .............. 250/214.1, 250/214 R, 214 A
See application file for complete search history.

(56) References Cited

U.S. PATENT DOCUMENTS

| 4,096,512 | A  | 6/1978 | Polinsky |
| 5,130,775 | A  | 7/1992 | Maeda |
| 6,157,035 | A  | 12/2000 | Kuijk |
| 6,218,719 | B1 | 4/2001 | Tsang |
| 6,724,063 | B2 | 4/2004 | Kuhara |
| 7,105,799 | B2 | 9/2006 | Chen |
| 7,180,048 | B1 * | 2/2007 | Zhao ..................... 250/214 R |
| 2002/0047174 | A1 | 4/2002 | Du Pauw et al. |

FOREIGN PATENT DOCUMENTS

| EP | 0 875 939 A1 | 4/1998 |
| EP | 0 877 426 A1 | 11/1998 |

OTHER PUBLICATIONS

Bontems et al., "Synthesis and Properties of Monodisperse Polydimethylsiloxane Networks"; 907 Journal of Polymer Science Part A: Polymer Chemistry Edition 31, No. 11, New York, US; pp.: 2697-2710 (Oct. 1993).

Kuijk, M., et al., "Spatially Modulated Light Detector in CMOS with Sense-Amplifier Receiver Operating at 180 Mb/s for Optical Data Link Applications and Parallel Optical Interconnects Between Chips," IEEE J. Selected Topics Quantum Electronics 4(6):1040-1045 (1998).

(Continued)

*Primary Examiner*—John R Lee
(74) *Attorney, Agent, or Firm*—Fliesler Meyer LLP

(57) ABSTRACT

Systems and methods for slow tail compensation are provided. A photodetector signal is pre-amplified to thereby produce an uncompensated photodetector signal that includes a fast component and a slow component. The fast component is removed from the uncompensated photodetector signal to thereby produce a compensating signal that includes the slow component of the uncompensated photodetector signal. The compensating signal is subtracted from the uncompensated photodetector signal to thereby produce a compensated photodetector signal that includes the fast component but not the slow component.

20 Claims, 5 Drawing Sheets

OTHER PUBLICATIONS

Lalanne, P. et al., "CMOS Photodiodes Based on Vertical p-n-p Junctions," 11th International Parallel Processing Symposium, Apr. 1-5, 1997, Published by IEEE, 8 pages.

Rooman, C. et al., "Asynchronous 250-Mb/s Optical Receivers with Integrated Detector in Standard CMOS Technology for Optocoupler Applications," IEEE J. Solid-State Circuits 35(7):953-958 (2000).

Windisch et al., "Large-Signal-Modulation of High-Efficiency Light-Emitting Diodes for Optical Communication"; IEEE Journal of Quantum Electronics, vol. 36, No. 12; pp: 1445-1453 (Dec. 2000).

Woodward, T.K., et al., "1-Gb/s Integrated Optical Detectors and Receivers in Commercial CMOS Technologies," IEEE J. Selected Topics Quantum Electronics 5(2):146-158 (1999).

W. Zhang et al., "Performance of a CMOS Compatible Lateral Bipolar Photodetector on SOI Substrate," IEEE Electron Device Letts. 19(11):435-437 (1998).

Zimmerman, H., ed., "Integrated Silicon Opto-electronics," Photonics pp. 4-6, 15-22, Springer (2000).

"APC Amplifier with Integrated Photodetector for 24X CD-R and CD-RW Applications," Sipex SP8020, Sipex Corporation, 7 pp. (Mar. 9, 2001).

"Photodetector Elements," 3 pp., http://www.iee.et.tu-dresden.de/iee/eb/analog/papers/mirrow/visionchip. . . /photodetector.htm, printed Oct. 24, 2002.

* cited by examiner

FIG. 1 Transient Behavior of Photocurrent for Carrier Drift and Diffusion

SLOW TAIL COMPENSATION

PRIORITY CLAIM

The present application is a continuation of U.S. patent application Ser. No. 11/322,313, entitled "Slow Tail Compensation," filed Dec. 30, 2005 (now allowed), which claims priority under 35 U.S.C. § 119(e) to U.S. Provisional Patent Application No. 60/733,047, filed Nov. 3, 2005. Each of the above applications is incorporated by reference herein.

FIELD OF THE INVENTION

Embodiments of the present invention relate generally to systems (e.g., circuits) and methods that perform slow tail compensation. Specific embodiments of the present invention provide an effective solution to compensate for slow diffusive carriers generated in a conventional CMOS photodetector.

BACKGROUND

For various reasons, there has recently been increased interest in fast photodetectors produced using complementary-metal-oxide semiconductor (CMOS) technology. First, CMOS circuitry is generally less expensive than other technologies, such as Gallium Arsenide or bipolar silicon technologies. Further, CMOS circuitry generally dissipates less power than other technologies. Additionally, CMOS photodetectors can be formed on the same substrate as other low power CMOS devices, such as metal-oxide semiconductor field effect transistors (MOSFETs).

However, despite the potential advantages, there are various reasons why conventional CMOS technology has not been optimal for producing a fast photodetector. More specifically, photodetectors produced using CMOS technology have proven to be much slower than photodetectors produced using other technologies, such as bipolar silicon technology. The slower the photodetector, the lower the bandwidth of information that can be detected using the photodetector.

In a CMOS photodetector, photo-generated electron-hole pairs in the depletion region are collected quickly through carrier drift process due to the presence of strong electric field. On the other hand, carriers generated in the neutral zone of the substrate migrate by diffusion. The diffusion-based component has a much slower time-response than the field-aided drift counterpart. FIG. 1 illustrates the typical transient behavior of the photocurrent for carrier drift and diffusion. Accordingly, the output signal of the photodetector can be characterized by a fast time-constant $\tau_{fast}$ and a slow time-constant $\tau_{slow}$ representing carrier drift and diffusion respectively. In addition, $A_{fast}$ and $A_{slow}$ are the percentage contributions from carrier drift and carrier diffusion respectively. The summation of $A_{fast}$ and $A_{slow}$ is equal to 1.

To achieve high-speed operations, $A_{slow}$ should be kept to a minimum, normally less than 1% of the total amplitude. Otherwise, the transient response of photocurrent exhibits the so-called slow tail phenomena.

Several schemes have been suggested to minimize the slow tail effect in silicon technologies. In one scheme, a buried collector layer is used to screen out the slow diffusive carriers in bipolar or BiCMOS technologies. However, this topology results in responsivity that is typically low. It presents the most common tradeoff, that of responsivity for speed. In another scheme, a very thick and lowly-doped substrate is used with a large reverse bias voltage in nonstandard CMOS technology. However, this topology requires extra custom processing steps. In pure CMOS technology, a spatially modulated detector is the only scheme reported so far to achieve slow tail compensation. However, this approach suffers from a low responsivity since a substantial detector area is blocked to generate the slow diffusive component. Accordingly, there is still a need to provide an effective solution to compensate for slow diffusive carriers generated in a conventional CMOS photodetector.

SUMMARY

Embodiments of the present invention generally relate to systems (e.g., circuits) and methods that perform slow tail compensation. While especially useful with CMOS photodetectors, embodiments of the present invention are not limited to such uses.

In accordance with an embodiment, a slow tail compensation system includes a preamplifier stage, a slow tail compensator stage and a summing stage. The preamplifier stage amplifies a photodetector signal to thereby produce an uncompensated photodetector signal that includes a fast component and a slow component. The slow tail compensator stage removes the fast component from the uncompensated photodetector signal to thereby produce a compensating signal that includes the slow component of the uncompensated photodetector signal. The summing stage subtracts the compensating signal from the uncompensated photodetector signal to thereby produce a compensated photodetector signal that includes the fast component but not the slow component.

In accordance with an embodiment of the present invention, the slow tail compensator stage includes a low pass filter and an attenuator. The low pass filter allows the slow component of the uncompensated photodetector signal to pass without allowing the fast component of the uncompensated photodetector signal to pass. The attenuator causes the compensating signal, which is subtracted at the summing stage from the uncompensated photodetector signal, to have an amplitude corresponding to the slow component.

The uncompensated photodetector signal can be characterized by a fast time-constant ($\tau_{fast}$), a slow time-constant ($\tau_{slow}$), a fast amplitude contribution ($A_{fast}$) and a slow amplitude contribution ($A_{slow}$). In accordance with an embodiment of the present invention, a ratio of the attenuator is set be substantially equal to the slow amplitude contribution ($A_{slow}$).

In accordance with an embodiment of the present invention the low-pass filter is implemented using a simple filter including a resistor $R_{LPF}$ and a capacitor $C_{LPF}$, at least one of which is adjustable. In such an arrangement, the low pass-filter has a time-constant of $R_{LPF}*C_{LPF}$. In accordance with an embodiment, $C_{LPF}$ (and/or $R_{LPF}$) is set such that the product of $R_{LPF}*C_{LPF}$ is equal to the slow time-constant $\tau_{slow}$. More generally, the time constant of the low-pass filter is set to equal the slow time-constant $\tau_{slow}$.

In accordance with an embodiment of the present invention, a first register is used to store a value of the slow time-constant ($\tau_{slow}$) and a second register is used to store a value of the slow amplitude contribution ($A_{slow}$). In such an arrangement, the overall characteristics of the slow tail compensation block can be adjusted, e.g., using a serial controller.

Preamplification and slow tail compensation can be performed in the current domain, the voltage domain, or combinations thereof. For example, the preamplifier stage can include a transimpedance amplifier that converts the current output of a photodetector to the voltage domain. The slow tail compensation can then be performed in the voltage domain. Alternatively, the output of the transimpedance amplifier can be converted to a current, e.g., using a voltage to current (V2I)

converter. This will enable the slow tail compensation to be performed in the current domain. In still another embodiment, a current-mode preamplifier is used in place of the transimpedance amplifier.

Further and alternative embodiments, and the features, aspects, and advantages of the present invention will become more apparent from the detailed description set forth below, the drawings and the claims.

DETAILED DESCRIPTION

Figure 1:
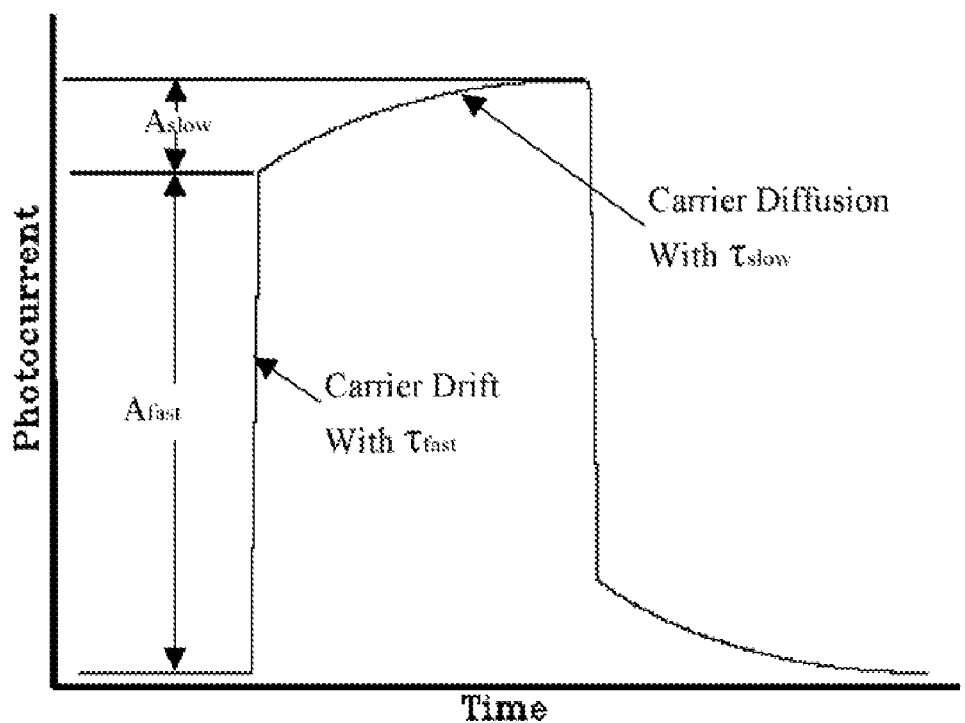
FIG. 1 is a graph of photocurrent versus time, which shows the transient behavior of a photocurrent due to carrier drift and diffusion.
Figure 2:
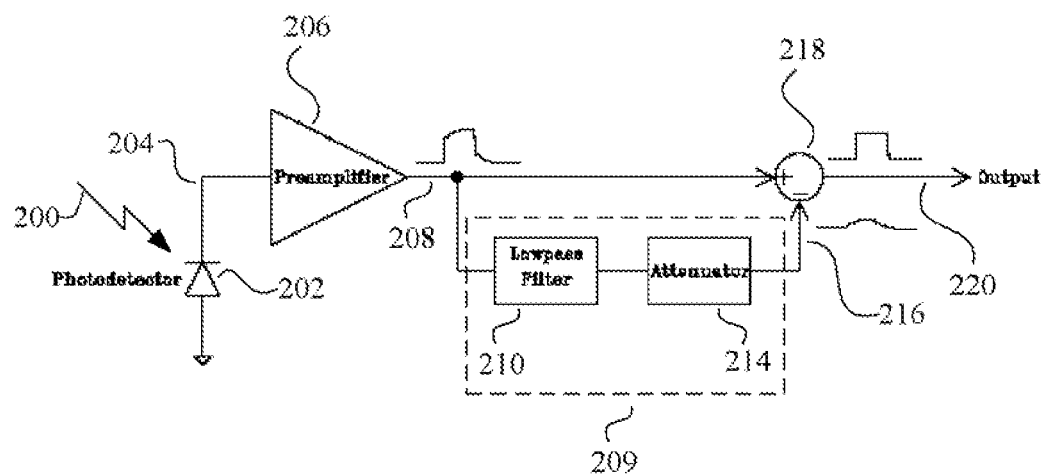
FIG. 2 is a high level block diagram useful for explaining how slow tail compensation can be performed in accordance with embodiments of the present invention.

FIG. 2 illustrates the basic concept of the proposed slow tail compensation, according to an embodiment of the present invention. When an optical signal 200 is incident on a photodetector 202, the photodetector 202 converts the incident optical signal 200 into electrical current signal 204 (also referred to as a photodetector signal 204). This photodetector signal 204 is provided to a preamplifier stage 206. The preamplifier 206, depending on implementation, can amplify the photodetector signal 204 in the current or voltage domain, and may output either a current or voltage signal, which is referred to hereafter as an uncompensated photodetector signal 208. This uncompensated photodetector signal 208 goes directly to a summing stage 218, and also goes to a slow tail compensation block 209, which in accordance with an embodiment of the present invention, is formed by a low-pass filter 210 and an attenuator 214.

The slow tail compensation is performed by two steps. The first step is to set (e.g., adjust) the time-constant of the low-pass filter 210 to be the same as $\tau_{slow}$. This will cause the low-pass filter 210 to filter out the fast component, leaving only the slow component with the time-constant of $\tau_{slow}$. The second step is to set (e.g., adjust) the ratio of the attenuator 214 to be the same as $A_{slow}$. This will cause the compensating signal 216 at the output of the attenuator 214 to include only the slow component with the amplitude of $A_{slow}$. The summing stage 218 subtracts this compensating signal 216 from the uncompensated photodetector signal 208, with the resulting output signal 220 (also referred to as the compensated photodetector signal) including the fast component with the amplitude of $A_{fast}$, but not the slow component, and thus being properly compensated. It is noted that the order of low-pass filter 210 and the attenuator 214 can be exchanged (i.e., the attenuator 214 can be located before the low-pass filter 210, or be combined with the low-pass filter) without affecting the overall slow tail compensation function.

Figure 3:
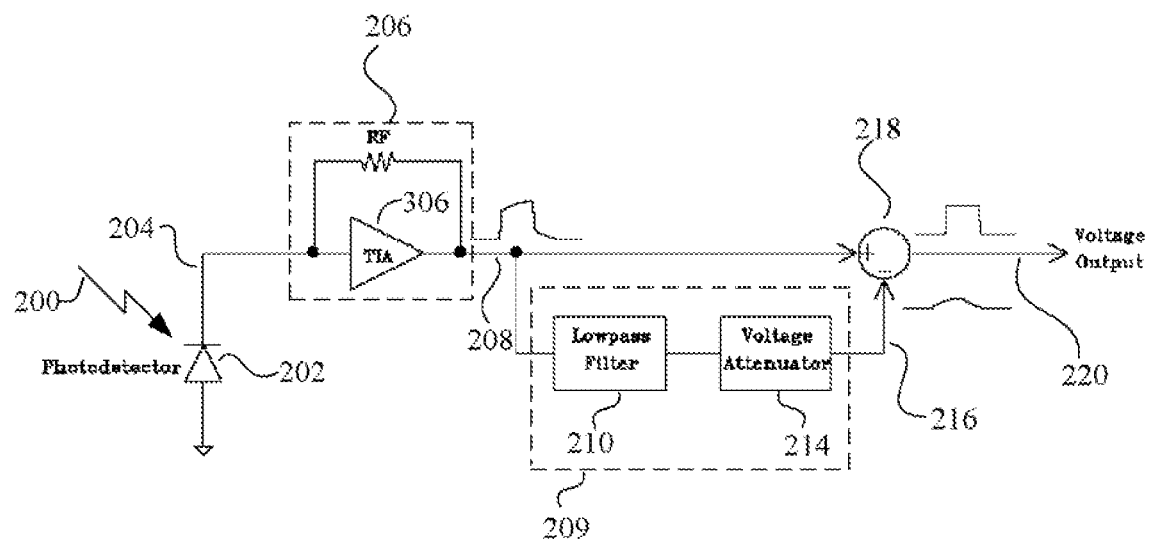
FIG. 3 is a high level block diagram that illustrates how a transimpedance amplifier can be used to implement the preamplifier stage of FIG. 2, in accordance with an embodiment of the present invention.
Figure 4:
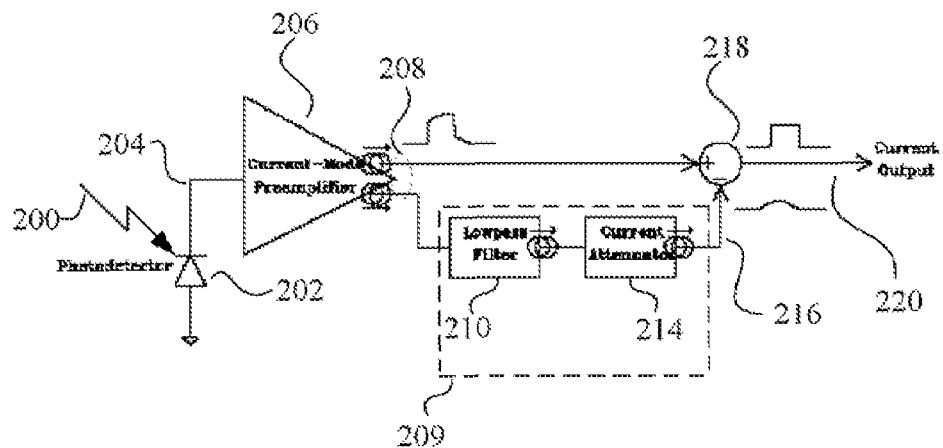
FIG. 4 is a high level block diagram that illustrates how a current mode preamplifier can be used to implement the preamplifier stage of FIG. 2, in accordance with an embodiment of the present invention.

Dependent upon the configurations of the preamplifier 206, the proposed slow tail compensation scheme can be implemented in either the voltage or current domain, as shown in FIGS. 3 and 4, respectively. In the embodiment of FIG. 3, a transimpedance amplifier, which includes an operational amplifier 306 (labeled TIA) and a feedback resistor RF, is used to implement the preamplifier 206. In such an embodiment, the transimpedance amplifier converts the photocurrent signal 204 to a voltage, thus resulting in the uncompensated photodetector signal 208 being a voltage signal. It is noted that a transimpedance amplifier is also known as a current-to-voltage (I2V) converter, because of the function it performs.

In another embodiment, shown in FIG. 4, the preamplifier 206 is a current-mode preamplifier, thus resulting in the uncompensated photodetector signal 208 being a current signal. Such pure current-mode preamplifiers are sometimes adopted for their superior signal handling capability.

Figure 5:
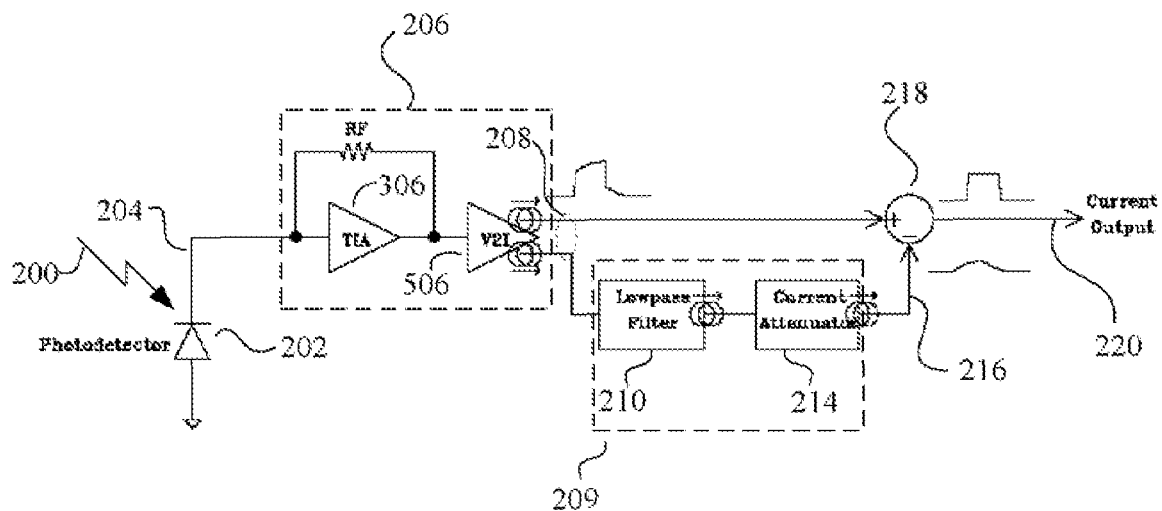
FIG. 5 is a high level block diagram that illustrates how a transimpedance amplifier and a voltage-to-current (V2I) converter can be used so that preamplification is performed in the voltage domain, while slow tail compensation is performed in the current domain, in accordance with an embodiment of the present invention.

In another embodiment, shown in FIG. 5, a combination of a transimpedance amplifier and a voltage-to-current (V2I) converter 506 is used as the preamplifier 206. More specifically, in the embodiment of FIG. 5, amplification is performed in the voltage domain using a transimpedance amplifier including the operational amplifier 306 (labeled TIA) and the feedback resistor RF. The voltage-to-current (V2I) converter 506 converts the voltage output of the transimpedance amplifier to a current, thereby enabling the slow tail compensation to be performed in the current domain. Such embodiment takes advantage of the lower input noise provided by the transimpedance amplifier, and the flexibility offered by the current-mode signal processing.

Figure 6:
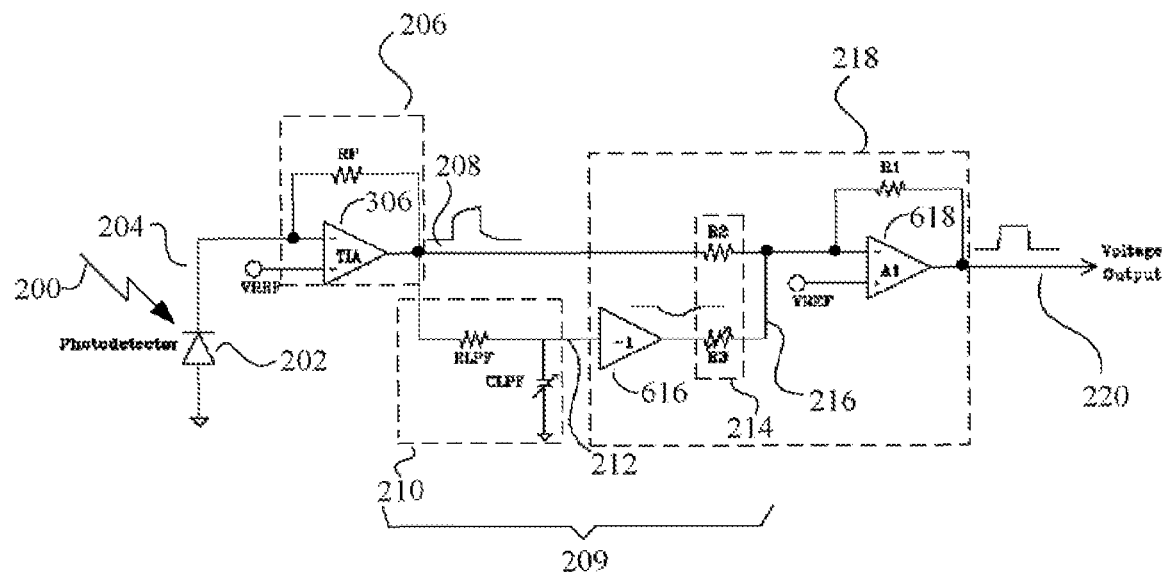
FIG. 6 illustrates a circuit implementation of the embodiment of FIG. 3, according to an embodiment of the present invention.

FIG. 6 illustrates a circuit, according to an embodiment of the present invention, that performs slow tail compensation in the voltage domain. Accordingly, FIG. 6 illustrates an exemplary implementation of the voltage domain embodiment of FIG. 3. The resistor RLPF and the capacitor CLPF form the low-pass filter (LPF) 210, with a time-constant of RLPF*CLPF. Preferably, CLPF (and/or RLPF) is adjusted such that the product of RLPF*CLPF is equal to $\tau_{slow}$. Resistors R2 and R3 form the attenuator 214, with the attenuation set by the ratio R2/R3. Preferably, the resistor R3 (and/or the resistor R2) is adjusted such that the ratio of R2/R3 is equal to $A_{slow}$. In this case the attenuator 214 is part of the summing stage 218, as illustrated in FIG. 6, with the summing stage including resistors R1, R2 and R3 along with an amplifier 618 (labeled A1). An inverting stage 616 (labeled −1) is inserted between the low-pass filter 210 and the resistor R3, so that the summing stage 218 performs the required subtracting function. One of ordinary skill in the art would appreciate, from the description herein, that alternative circuits are also within the scope of the present invention.

Figure 7:
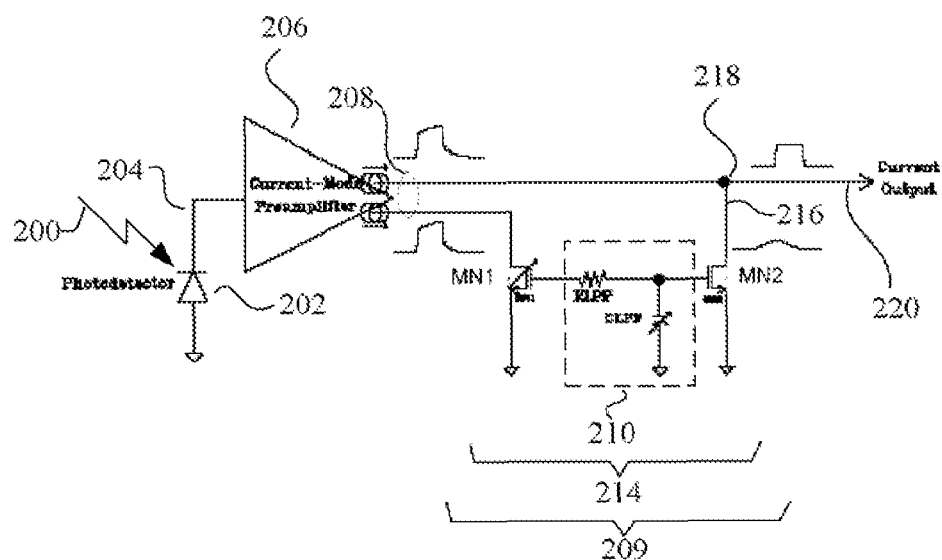
FIG. 7 illustrates a circuit implementation of the embodiment of FIG. 4, according to an embodiment of the present invention.

FIG. 7 illustrates a circuit, according to an embodiment of the present invention, that performs slow tail compensation in the current domain. Accordingly, FIG. 7 illustrates an exemplary implementation of the embodiment of FIG. 4 where pre-amplification and slow tail compensation are both performed in the current domain. In FIG. 7, the low-pass filter (LPF) 210 is provided by the resistor RLPF and the capacitor CLPF, which function in a similar manner as described above with reference to FIG. 6. However, in this embodiment, the attenuator 214 is provided by the current mirror formed by transistors MN1 and MN2, with the aspect ratio of the transistors specifying the amount of attenuation. Preferably, the ratio MN2/MN1 is equal to $A_{slow}$. As would be understood by one of ordinary skill in the art, transistors MN1 and/or MN2 could be replaced by a more complicated current mirror DAC to provide for finer resolution. One of ordinary skill in the art would appreciate, from the description herein, that alternative circuits are also within the scope of the present invention.

Figure 8:
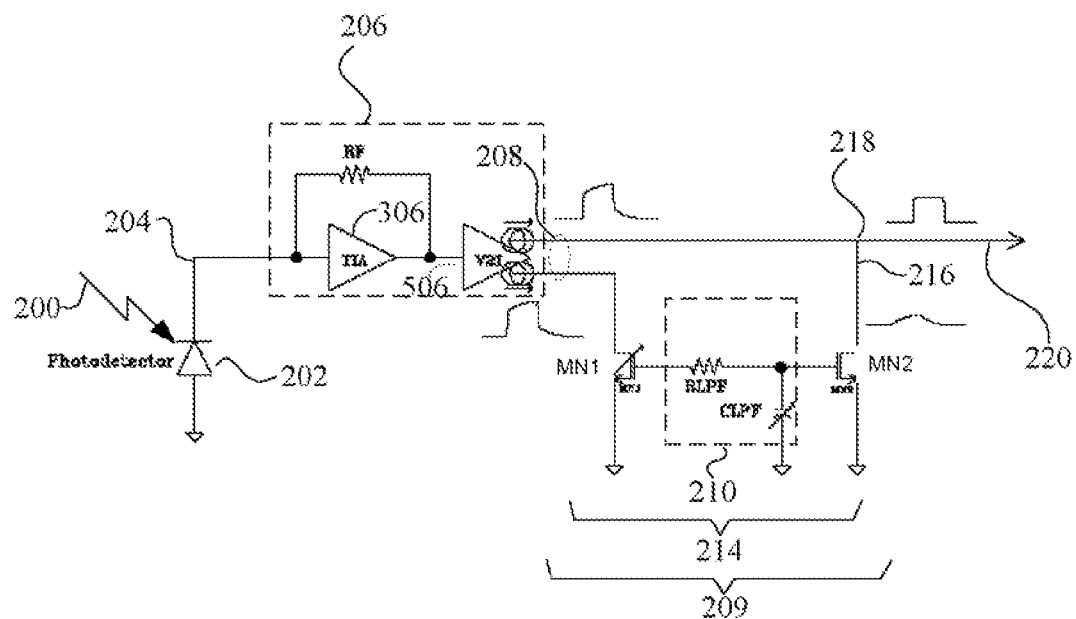
FIG. 8 illustrates a circuit implementation of the embodiment of FIG. 5, according to an embodiment of the present invention.

FIG. 8 illustrates a circuit, according to an embodiment of the present invention, that uses a combination of a transimpedance amplifier and a voltage-to-current (V2I) converter. Accordingly, FIG. 8 illustrates an exemplary implementation of the embodiment of FIG. 5 where pre-amplification is performed in the voltage domain, and slow tail compensation is performed in the current domain. In FIG. 8, the low-pass filter 210 is provided by the resistor RLPF and the capacitor CLPF, as was the case in FIGS. 6 and 7 described above. The attenuator 214 is provided by the current mirror formed by transistors MN1 and MN2, as was the case in FIG. 7 described above. One of ordinary skill in the art would appreciate, from the description herein, that alternative circuits are also within the scope of the present invention.

Figure 9:
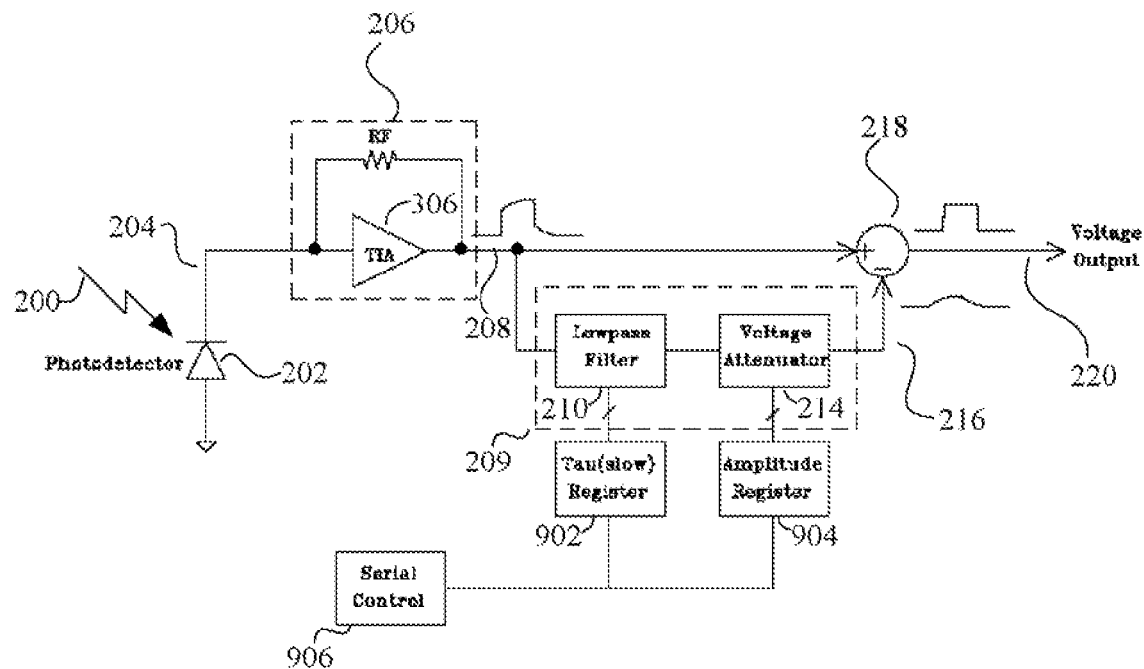
FIG. 9 illustrates how the slow time-constant $\tau_{slow}$ and the slow amplitude contribution $A_{slow}$ can be adjusted using a pair of registers and a serial controller, in accordance with an embodiment of the present invention.

In accordance with specific embodiments of the present invention, the proposed slow tail compensation is suitable for programmable trimming via a controller, e.g., a serial control. FIG. 9 demonstrates such an implementation. In this embodiment, a register 902 stores a value for $\tau_{slow}$ and a register 904 stores a value for $A_{slow}$. In this arrangement, values of $\tau_{slow}$ and $A_{slow}$ can be adjusted through a serial controller 906, and easily stored in the registers 902 and 904. For example, assume each register is an 8-bit register, this would allow up to 256 values for of $\tau_{slow}$ and 256 values for $A_{slow}$ to be selectable. Other types of controllers, besides a serial controller, can also be used. In another embodiment a register bank 902 stores multiple values for $\tau_{slow}$ and a register bank 904 stores multiple values for $A_{slow}$, and the serial controller, or some other type of controller, selects one of the values stored in registers 902 for $\tau_{slow}$ and one of the values stored in registers 904 for $A_{slow}$.

Where an adjustable capacitor CLFP is used within the low-pass filter 210, the adjustable capacitor can be implemented, e.g., using a bank of parallel selectable capacitors, each of which has a respective switch (e.g., a switching transistor). Each capacitor can have the same capacitance, or more likely, each capacitor is differently weighted to provide for a wider range of possible capacitances. The capacitors can be weighted in a progressive fashion (e.g., C, 2C, 3C, 4C . . . ), a binary fashion (e.g., C, 2C, 4C, 8C . . . ), or in any other arrangement.

Where an adjustable resistor RLFP is used within the low-pass filter 210, the adjustable resistor can be similarly implemented, e.g., using a bank of parallel selectable resistors, each of which has a respective switch (e.g., a switching transistor). Each resistor can have the same resistance, or more likely, each resistor is differently weighted to provide for a wider range of possible resistances. A similar arrangement can be used if an adjustable resistor is used within the attenuator 214, e.g., as shown in FIG. 6. It is also possible to implement an adjustable resistor using a bank of parallel transistors (e.g., CMOS transistors) arranged such that their gate or base currents can be adjusted to achieve a desired resistance.

Where the attenuator 214 is implemented using a current mirror, the adjustable transistor (e.g., MN1 in FIGS. 7 and 8) of the current mirror can be implemented, e.g., using a bank of parallel selectable transistors. Preferably, the transistor bank can include transistors of different sizes that can be used to achieve a broad range of values for $A_{slow}$.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention. For example, the voltage-to-current (V2I) converter 506 in FIGS. 5 and 8 can be considered to be inside or outside the preamplifier stage 206.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed is:

1. A system with improved response time, comprising:
a first stage that outputs an uncompensated photodetector signal, when light is incident upon a photodetector, where the uncompensated photodetector signal includes a fast component and a slow component;
a second stage that receives the uncompensated photodetector signal, or a signal indicative thereof, and outputs a further signal indicative of the slow component; and
a third stage that subtracts the further signal from the uncompensated photodetector signal, or a signal indicative thereof, to thereby produce a compensated photodetector signal that is indicative of the fast component and compensates for the slow component.

2. The system of claim 1, wherein the second stage includes:
a filter that allows the slow component to pass without allowing the fast component to pass.

3. The system of claim 2, where the second stage also includes:
an attenuator that causes the further signal to have an amplitude corresponding to the slow component.

4. The system of claim 3, wherein:
the uncompensated photodetector signal has a corresponding fast time-constant ($\tau_{fast}$), a slow time-constant ($\tau_{slow}$), a fast amplitude contribution ($A_{fast}$) and a slow amplitude contribution ($A_{slow}$); and
a ratio of the attenuator is substantially equal to the slow amplitude contribution ($A_{slow}$).

5. The system of claim 4, wherein:
a time constant of the filter is substantially equal to the slow time-constant $\tau_{slow}$.

6. The system of claim 5, further comprising:
a controller to set the time constant of the filter and the ratio of the attenuator.

7. A method for improving the response time of a system including a photodetector, where an uncompensated photodetector signal is produced when light is incident upon the photodetector, and where the uncompensated photodetector signal includes a fast component and a slow component, the method comprising:
(a) producing, based on the uncompensated photodetector signal or a signal indicative thereof, a further signal indicative of the slow component of the uncompensated photodetector signal; and
(b) producing a compensated photodetector signal, that is indicative of the fast component and compensates for the slow component, by subtracting the further signal from the uncompensated photodetector signal or a signal indicative thereof.

8. The method of claim 7, wherein:
step (a) includes filtering and attenuating the uncompensated photodetector signal or a signal indicative thereof, to produce the further signal.

9. The method of claim 8, wherein:
the attenuating causes the further signal to have an amplitude indicative of the slow component of the uncompensated photodetector signal.

10. The method of claim 8, wherein:
the filtering allows the slow component to pass without allowing the fast component pass.

11. The method of claim 8, wherein:
the uncompensated photodetector signal has a corresponding fast time-constant ($\tau_{fast}$) a slow time-constant ($\tau_{slow}$), a fast amplitude contribution ($A_{fast}$) and a slow amplitude contribution ($A_{slow}$); and
a ratio used for the attenuating is substantially equal to the slow amplitude contribution ($A_{slow}$).

12. The method of claim 11, wherein:
a time constant used for the filtering is substantially equal to the slow time-constant $T_{slow}$.

13. A system for use with a photodetector, where an uncompensated photodetector signal is produced when light is incident upon the photodetector, and where the uncompensated photodetector signal includes a fast component and a slow component, the system comprising:
a first stage to produce, based on the uncompensated photodetector signal or a signal indicative thereof, a further signal indicative of the slow component of the uncompensated photodetector signal; and
a second stage to produce a compensated photodetector signal, that is indicative of the fast component and compensates for the slow component, by subtracting the further signal from the uncompensated photodetector signal or a signal indicative thereof.

14. The system of claim 13, wherein:
the second stage includes a filter that allows the slow component to pass without allowing the fast component to pass.

15. The system of claim 14, wherein:
the second stage also includes an attenuator that causes the further signal to have an amplitude corresponding to the slow component.

16. The system of claim 15, wherein:
the uncompensated photodetector signal has a corresponding a fast time-constant ($\tau_{fast}$) a slow time-constant ($\tau_{slow}$), a fast amplitude contribution ($A_{fast}$) and a slow amplitude contribution ($A_{slow}$); and
a ratio of the attenuator is substantially equal to the slow amplitude contribution ($A_{slow}$).

17. The system of claim 16, wherein:
a time constant of the filter is substantially equal to the slow time-constant $\tau_{slow}$.

18. The method of claim 9, wherein:
the filtering allows the slow component to pass without allowing the fast component pass.

19. A method for improving the response time of a system including a photodetector, where an uncompensated photodetector signal is produced when light is incident upon the photodetector, and where the uncompensated photodetector signal includes a fast component and a slow component, the method comprising:
(a) producing, based on the uncompensated photodetector signal or a signal indicative thereof, a further signal indicative of the slow component of the uncompensated photodetector signal; and
(b) producing a compensated photodetector signal based on the further signal and the uncompensated photodetector signal or a signal indicative thereof, wherein the compensated photodetector signal is indicative of the fast component and compensates for the slow component.

20. A system with improved response time, comprising:
a first stage that outputs an uncompensated photodetector signal, when light is incident upon a photodetector, where the uncompensated photodetector signal includes a fast component and a slow component;
a second stage that receives the uncompensated photodetector signal, or a signal indicative thereof, and outputs a further signal indicative of the slow component; and
a third stage that receives the further signal and the uncompensated photodetector signal, or a signal indicative thereof, and produces therefrom a compensated photodetector signal that is indicative of the fast component and compensates for the slow component.

* * * * *